US010618004B2

(12) United States Patent
Yamada et al.

(10) Patent No.: US 10,618,004 B2
(45) Date of Patent: Apr. 14, 2020

(54) ABATEMENT DEVICE

(71) Applicant: Edwards Japan Limited, Yachiyo-shi, Chiba (JP)

(72) Inventors: Toshiki Yamada, Yachiyo (JP); Alexander Michael Pope, Clevedon (GB); Alistair Bennett, Clevedon (GB); Steven Barlow, Clevedon (GB); Christopher Peter Jones, Clevedon (GB)

(73) Assignee: Edwards Japan Limited, Yachiyo-shi (JP)

( * ) Notice: Subject to any disclaimer, the term of this patent is extended or adjusted under 35 U.S.C. 154(b) by 240 days.

(21) Appl. No.: 15/523,787

(22) PCT Filed: Nov. 5, 2015

(86) PCT No.: PCT/JP2015/081146
§ 371 (c)(1),
(2) Date: Sep. 28, 2017

(87) PCT Pub. No.: WO2016/076190
PCT Pub. Date: May 19, 2016

(65) Prior Publication Data
US 2018/0015413 A1     Jan. 18, 2018

(30) Foreign Application Priority Data

Nov. 14, 2014    (JP) .................................. 2014-231944

(51) Int. Cl.
*B01D 53/96*     (2006.01)
*B01D 53/68*     (2006.01)
(Continued)

(52) U.S. Cl.
CPC ............. *B01D 53/96* (2013.01); *B01D 21/26* (2013.01); *B01D 21/267* (2013.01); *B01D 47/14* (2013.01);
(Continued)

(58) Field of Classification Search
CPC ........ B01D 53/68; B01D 53/40; B01D 53/78; B01D 53/92; B01D 53/96; B01D 21/267;
(Continued)

(56) References Cited

U.S. PATENT DOCUMENTS 1,417,064 A *   5/1922   Holmgren ................. B04B 3/00
                                                                494/36
6,103,944 A      8/2000   Blake et al.
(Continued)

FOREIGN PATENT DOCUMENTS

BR       1007444 PI      6/2017
CN       1077138 A       10/1993
(Continued)

OTHER PUBLICATIONS

Translation and original International Search Report and Written Opinion dated Feb. 2, 2016 in counterpart PCT Application No. PCT/JP2015/081146, 8 pgs.
(Continued)

*Primary Examiner* — Thuan D Dang
(74) *Attorney, Agent, or Firm* — Shumaker & Sieffert, P.A.

(57) ABSTRACT

Provided is an abatement device that reduces an amount of drainage of circulating water. The abatement device lowers an average drainage flow of circulating water to a low flow, when a ratio of a concentration of silicon dioxide within the circulating water and a concentration of hydrogen fluoride within the circulating water is greater than or equal to a predetermined value at which hydrofluorosilicic acid can be
(Continued)

produced, and raises the average drainage flow of the circulating water to a high flow higher than the low flow, when the ratio of the concentration of silicon dioxide within the circulating water and the concentration of hydrogen fluoride within the circulating water is less than the predetermined value.

19 Claims, 3 Drawing Sheets

(51) Int. Cl.
    *B01D 21/26*     (2006.01)
    *B01D 53/40*     (2006.01)
    *H01L 21/31*     (2006.01)
    *B01D 53/78*     (2006.01)
    *B01D 47/14*     (2006.01)
    *C23C 16/44*     (2006.01)
    *C23C 16/52*     (2006.01)
    *B01D 53/34*     (2006.01)

(52) U.S. Cl.
    CPC .............. *B01D 53/40* (2013.01); *B01D 53/68* (2013.01); *B01D 53/78* (2013.01); *C23C 16/4412* (2013.01); *C23C 16/52* (2013.01); *H01L 21/31* (2013.01); *B01D 53/346* (2013.01); *B01D 2252/103* (2013.01); *B01D 2257/2047* (2013.01); *B01D 2257/553* (2013.01); *B01D 2258/0216* (2013.01); *Y02C 20/30* (2013.01)

(58) Field of Classification Search
    CPC . B01D 47/14; B01D 21/26; B01D 2258/0216
    USPC .......... 96/243, 244, 228, 238, 252, 255, 265; 95/9, 12, 8
    See application file for complete search history.

(56) References Cited

U.S. PATENT DOCUMENTS

| | | | |
|---|---|---|---|
| 6,986,874 B2 | 1/2006 | Satchell, Jr. et al. |
| 7,659,430 B2 | 2/2010 | Woelfert et al. |
| 7,718,151 B1 | 5/2010 | Hu |
| 8,475,563 B2 | 7/2013 | Chandler et al. |
| 9,266,055 B2 | 2/2016 | Königsson et al. |
| 2007/0264807 A1 | 11/2007 | Leone et al. |
| 2009/0274606 A1 | 11/2009 | Nagano et al. |
| 2010/0126349 A1 | 5/2010 | Vermeulen |
| 2010/0139481 A1 | 6/2010 | Chandler et al. |
| 2011/0020187 A1 | 1/2011 | Hiraiwa et al. |
| 2011/0158878 A1 | 6/2011 | Kawabata |
| 2013/0064730 A1 | 3/2013 | Nakayama et al. |
| 2014/0131880 A1 | 5/2014 | Clevenger et al. |

FOREIGN PATENT DOCUMENTS

| | | | |
|---|---|---|---|
| CN | 1358665 A | 7/2002 |
| CN | 101018596 A | 8/2007 |
| CN | 101023198 A | 8/2007 |
| CN | 101291875 A | 10/2008 |
| CN | 101610831 A | 12/2009 |
| CN | 101959594 A | 1/2011 |
| CN | 102186559 A | 9/2011 |
| CN | 102612626 A | 7/2012 |
| CN | 102762502 A | 10/2012 |
| EP | 2168655 A1 | 3/2010 |
| EP | 2094373 B1 | 9/2010 |
| JP | 2005334729 A | 12/2005 |
| JP | 2006095486 A | 4/2006 |
| JP | 2006159017 A | 6/2006 |
| JP | 4394555 B2 | 1/2010 |
| JP | 4434933 B2 | 3/2010 |
| JP | 2010063951 A | 3/2010 |
| JP | 5457193 B2 | 4/2014 |
| JP | 2014113583 A | 6/2014 |
| KR | 20050068672 A | 7/2005 |
| KR | 200474985 Y1 | 11/2014 |
| WO | 2010088270 A2 | 8/2010 |
| WO | 2014031325 A1 | 2/2014 |

OTHER PUBLICATIONS

Extended Search Report from counterpart European Application No. 15858179.3, dated May 9, 2018, 7 pp.

\* cited by examiner

ABATEMENT DEVICE

This application is a U.S. national phase application under 37 U.S.C. § 371 of international application number PCT/JP2015/081146 filed on Nov. 5, 2015, which claims the benefit of priority to JP application number 2014-231944 filed Nov. 14, 2014. The entire contents of each of international application number PCT/JP2015/081146 and JP application number 2014-231944 are incorporated herein by reference.

BACKGROUND OF THE INVENTION

1. Field of the Invention

The present invention relates to an abatement device, particularly to an abatement device that processes process gas containing silicon and cleaning gas containing fluorine.

2. Description of the Related Art

In semiconductor manufacturing devices, liquid crystal panel manufacturing devices, solar cell manufacturing devices, and the like, process gas containing silicon (Si) and cleaning gas containing fluorine (F) are used. For example, in a semiconductor manufacturing process, process gas, e.g., monosilane ($SiH_4$), is introduced into a process chamber upon performing, for example, a chemical vapor deposition (CVD) process in which an insulator, a metal film, or the like is deposited on a semiconductor wafer to form a film using a chemical vapor reaction.

Upon removing a product adhering within the process chamber, cleaning gas, such as nitrogen trifluoride ($NF_3$), in accordance with the type of product is regularly introduced into the process chamber, for cleaning within the process chamber through decomposition and discharge of an adhering product.

The process gas and cleaning gas exhausted from the process chamber are introduced to an abatement device and rendered harmless through an abatement process performed in the abatement device. As such an abatement device, one including an acid removal unit that reduces an acidity of circulating water for a gas scrubbing unit and a filter unit that captures a solid particle within the circulating water is known (for example, see Japanese Patent No. 5457193).

The abatement device described above demands that a part of the circulating water be discharged and the circulating water be diluted with water, in order to maintain the acidity of the circulating water within a range in which hydrogen fluoride does not re-volatilize. There has been a problem that considerable costs are required for a drainage process of the circulating water.

SUMMARY OF THE INVENTION

The present invention has been made in view of such a conventional task, and an object is to provide an abatement device that reduces an amount of drainage of circulating water.

The present invention has been proposed in order to achieve the object described above. A first aspect of the invention provides an abatement device that processes exhaust gas containing silicon and exhaust gas containing fluorine, the abatement device including a drain tank for holding circulating water that dissolves silicon dioxide produced from the exhaust gas containing the silicon and hydrogen fluoride produced from the exhaust gas containing the fluorine, a circulation path communicating with the drain tank, a drain valve provided to the circulation path to drain a part of the circulating water outside, a makeup water supply means for supplying makeup water to the circulation path, and a control means for controlling the drain valve and the makeup water supply means to control an average drainage flow of the circulating water within the circulation path, wherein the control means lowers the average drainage flow of the circulating water to a low flow, when a ratio of a concentration of the silicon dioxide within the circulating water and a concentration of the hydrogen fluoride within the circulating water is greater than or equal to a predetermined value at which hydrofluorosilicic acid can be produced, and raises the average drainage flow of the circulating water to a high flow higher than the low flow, when the ratio of the concentration of the silicon dioxide within the circulating water and the concentration of the hydrogen fluoride within the circulating water is less than the predetermined value. The "average drainage flow" herein refers to an average drainage flow per unit time upon draining the circulating water outside.

With this configuration, the average drainage flow of the circulating water can be reduced, since the average drainage flow of the circulating water is lowered to the low flow while inhibiting volatilization of hydrogen fluoride within the circulating water, when hydrofluorosilicic acid can be produced with silicon dioxide and hydrogen fluoride.

A second aspect of the invention provides the abatement device with the configuration of the first aspect of the invention, wherein the control means determines the concentration of the silicon dioxide on the basis of an integrated amount of flow of the exhaust gas containing the silicon, the average drainage flow of the circulating water, and a flow of the makeup water.

With this configuration, the average drainage flow of the circulating water can be reduced, even when process gas does not flow into the abatement device, such as when a process chamber is to be cleaned within, since whether hydrofluorosilicic acid can be produced can be determined on the basis of the concentration of silicon dioxide remaining within the abatement device.

A third aspect of the invention provides the abatement device with the configuration of the first or second aspect of the invention, wherein the control means determines the concentration of the hydrogen fluoride on the basis of an integrated amount of flow of the exhaust gas containing the fluorine, the average drainage flow of the circulating water, and a flow of the makeup water.

With this configuration, the average drainage flow of the circulating water can be reduced, even when cleaning gas does not flow into the abatement device in a CVD process or the like, since whether hydrofluorosilicic acid can be produced can be determined on the basis of the concentration of hydrogen fluoride remaining within the abatement device.

A fourth aspect of the invention provides the abatement device with the configuration of any one of the first to third aspects of the invention, further including an acidity measuring means for measuring an acidity of the circulating water.

With this configuration, re-volatilization of hydrogen fluoride from the circulating water can be inhibited, since the circulating water is inhibited from becoming too strongly acidic in accordance with an amount of dissolution of hydrogen fluoride.

A fifth aspect of the invention provides the abatement device with the configuration in the fourth aspect of the invention, wherein the acidity is determined on the basis of a concentration of the hydrogen fluoride within the circulating water measured by a conductivity sensor.

With this configuration, the abatement device can be made inexpensive, maintenance-friendly, and to continue to operate over a long period, since the acidity of the circulating water is determined on the basis of the concentration of hydrogen fluoride measured by the conductivity sensor.

A sixth aspect of the invention provides the abatement device with the configuration of any one of the first to fifth aspects of the invention, further including a centrifugal separator that separates the silicon dioxide from the circulating water.

With this configuration, clogging with silicon dioxide in equipment on a downstream side of the centrifugal separator can be inhibited, and silicon dioxide necessary for reduction of the average drainage flow of the circulating water can be kept within the drain tank.

The present invention can reduce the average drainage flow, since volatilization of hydrogen fluoride within the circulating water is inhibited even with the average drainage flow of the circulating water lowered to the low flow, when hydrofluorosilicic acid can be produced with silicon dioxide and hydrogen fluoride.

DESCRIPTION OF THE PREFERRED EMBODIMENTS

In order to achieve an object of providing an abatement device that reduces an amount of drainage of circulating water, the present invention has been realized with an abatement device that processes exhaust gas containing silicon and exhaust gas containing fluorine, including a drain tank for holding circulating water that dissolves silicon dioxide produced from the exhaust gas containing the silicon and hydrogen fluoride produced from the exhaust gas containing the fluorine, a circulation path communicating with the drain tank, a drain valve provided to the circulation path to drain a part of the circulating water outside, a makeup water supply means for supplying makeup water to the circulation path, and a control means for controlling the drain valve and the makeup water supply means to control an average drainage flow of the circulating water within the circulation path, wherein the control means lowers the average drainage flow of the circulating water to a low flow, when a ratio of a concentration of the silicon dioxide within the circulating water and a concentration of the hydrogen fluoride within the circulating water is greater than or equal to a predetermined value at which hydrofluorosilicic acid can be produced, and raises the average drainage flow of the circulating water to a high flow higher than the low flow, when the ratio of the concentration of the silicon dioxide within the circulating water and the concentration of the hydrogen fluoride within the circulating water is less than the predetermined value.

EMBODIMENTS

An abatement device according to one embodiment of the present invention will be described below with reference to the drawings. Hereinafter, words "upper" and "lower" correspond to above and below in an up-down direction.

Figure 1:
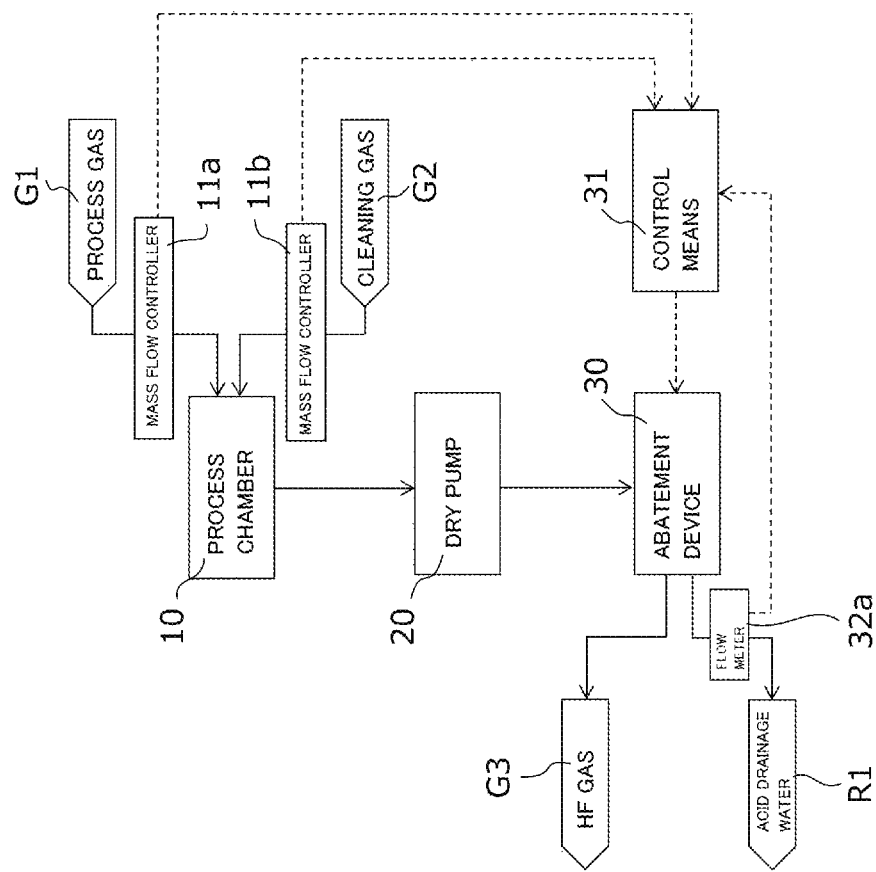
FIG. 1 is a block diagram showing connections of a process chamber, a dry pump, and an abatement device.

FIG. 1 is a diagram showing connections of a process chamber 10, a dry pump 20, and an abatement device 30.

The process chamber 10 is a part of a semiconductor manufacturing device, not shown. By performing a CVD process of causing deposition of a thin film on a surface of a semiconductor wafer, not shown, arranged within the process chamber 10, a device is obtained. In FIG. 1, one process chamber is connected to one abatement device. However, a plurality of process chambers may be connected to one abatement device.

Within the process chamber 10, process gas G1 containing silicon is supplied. The process gas G1 is supplied as a reactant for the CVD process within the process chamber 10. The process gas G1 supplied to the process chamber 10 is partly consumed upon the CVD process, and the rest is sucked by the dry pump 20.

Within the process chamber 10, cleaning gas G2 containing fluorine is supplied. By plasma etching performed in a state where the process chamber 10 is filled inside with the cleaning gas G2, a residue of the CVD process is caused to volatilize. The cleaning gas G2 supplied to the process chamber 10 is partly consumed upon a cleaning process, and the rest is sucked by the dry pump 20.

With a mass flow controller 11a, a flow of the process gas G1 is measured and sent to a control means 31. With a mass flow controller 11b, a flow of the cleaning gas G2 is measured and sent to the control means 31. Instead of providing the mass flow controllers 11a and 11b, the flows of the process gas G1 and cleaning gas G2 may be calculated on the basis of a processing condition of the semiconductor manufacturing device.

The process chamber 10 and the abatement device 30 are connected via the dry pump 20. With the dry pump 20, the process gas G1 and cleaning gas G2 remaining within the process chamber 10 are sucked and introduced to the abatement device 30.

With the abatement device 30, the process gas G1 and cleaning gas G2 introduced from the dry pump 20 are converted to granular silicon dioxide ($SiO_2$) and hydrogen fluoride (HF) gas G3, which are then separated from exhaust gas, incorporated into circulating water R2, and discharged into acid drainage water R1 to be rendered harmless. Specifically, a concentration of hydrogen fluoride contained within the exhaust gas is reduced to less than or equal to a predetermined value (e.g., 3 ppm). The acid drainage water R1 with dissolved hydrogen fluoride gas is drained. The form of silicon dioxide is not limited to being granular and may be, for example, in paste form.

The control means 31 controls an average drainage flow of circulating water for the abatement device 30, on the basis of the flows of the process gas G1 and cleaning gas G2 sent from the mass flow controllers 11a and 11b, an average drainage flow of the hydrogen fluoride gas G3 and acid drainage water R1 sent from a flow meter 32a, and a flow of makeup water, described later.

Figure 2:
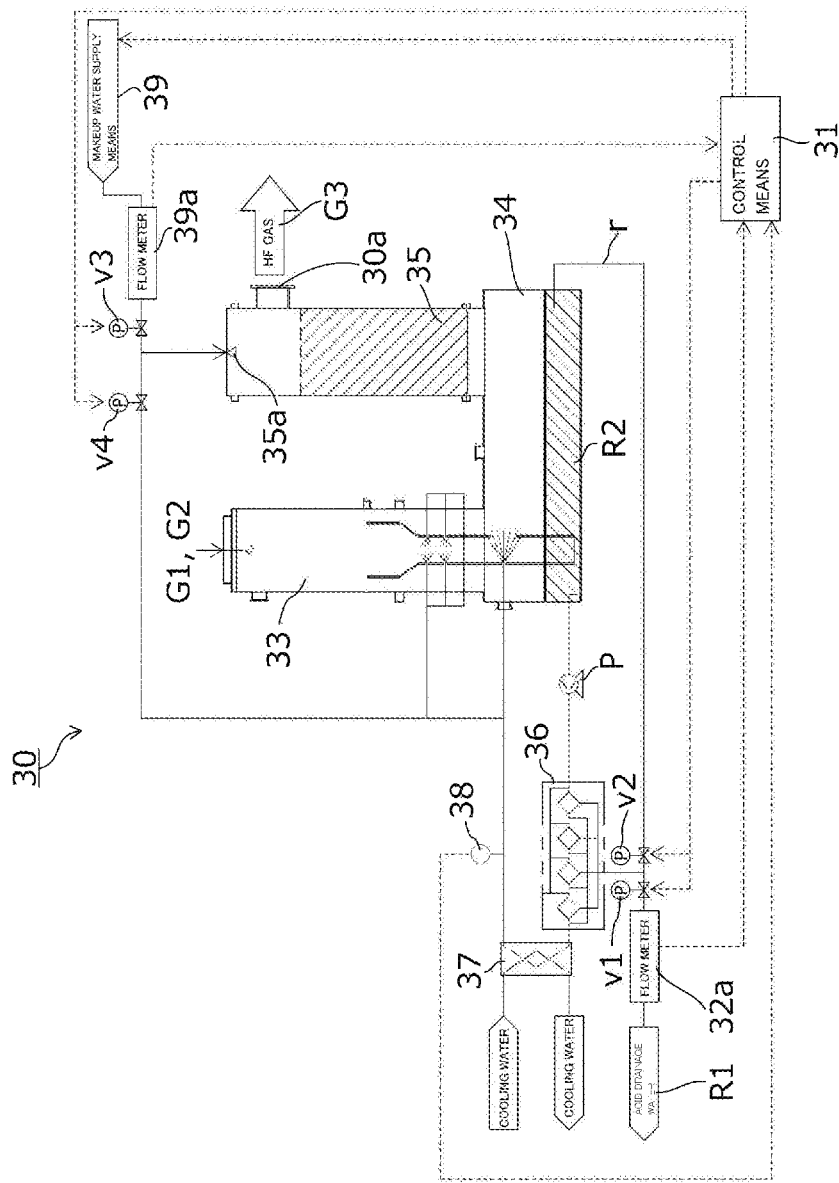
FIG. 2 is a schematic diagram showing the abatement device according to one embodiment of the present invention.
Figure 3:
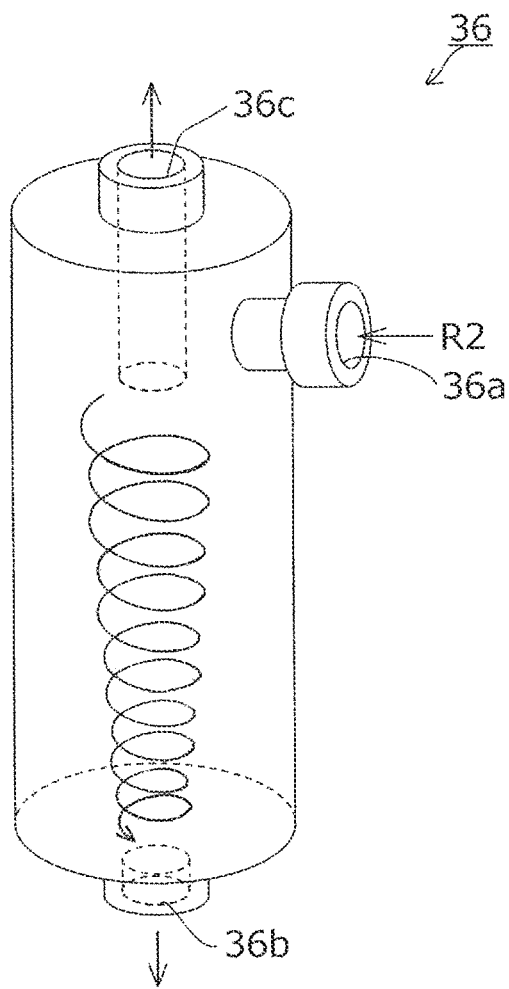
FIG. 3 is a perspective view showing a centrifugal separator.

Next, a specific configuration of the abatement device 30 will be described with reference to FIGS. 2 and 3. FIG. 2 is a schematic diagram showing the abatement device. FIG. 3 is a perspective view showing a centrifugal separator.

The abatement device 30 includes a heating means 33, a drain tank 34, and a packed tower 35. The process gas G1 and cleaning gas G2 introduced to the abatement device 30 flow through the heating means 33, the drain tank 34, and the packed tower 35 in that order and are exhausted outside from an outlet port 30a.

The heating means 33 heats the process gas G1 and the cleaning gas G2 to a high temperature. A temperature within the heating means 33 is set to, for example, 600° C. to 800° C. In this embodiment, a gas burner is employed as the heating means 33. The heating means 33 may be of any configuration, as long as the process gas G1 and the cleaning gas G2 can be heated. A heater-type for heating with radiation heat of an electric heater, a plasma-type for heating with plasma, and the like are acceptable.

The drain tank 34 is arranged below the heating means 33 and holds a predetermined amount of the circulating water R2. It is preferable that the drain tank 34 be made of corrosion-resistant plastic, such as polypropylene, and a temperature of the circulating water R2 be maintained at less than or equal to 60 degrees.

The packed tower 35 is provided above the drain tank 34. The packed tower 35 is filled inside with fine particles made of plastic, not shown, and water from a spray nozzle 35a arranged in an upper part of the packed tower 35 is sprayed toward the fine particles. Accordingly, water-soluble hydrogen fluoride gas dissolves in water on a surface of a fine particle and drips together with water to the drain tank 34.

The drain tank 34 communicates with a circulation path r, so that the circulating water R2 within the drain tank 34 circulates within the circulation path r. An upstream end of the circulation path r is connected to the drain tank 34. At a centrifugal separator 36, the circulation path r divides to connect to a heat exchanger 37 on one hand and connect to the drain tank 34 on the other. By opening a first valve v1, the circulating water R2 is drained outside as the acid drainage water R1. By opening a second valve v2, the circulating water R2 is caused to flow back to the drain tank 34. Reference sign P denotes a booster pump.

In the circulation path r, the centrifugal separator 36 is provided to separate out granular silicon dioxide within the circulating water R2. Through centrifugal separation, as shown by an arrow in FIG. 3, of the circulating water R2 that has flown in from a flow inlet port 36a, the centrifugal separator 36 discharges granular silicon dioxide from a lower outlet port 36b and drains the circulating water R2 not containing silicon dioxide from an upper outlet port 36c.

The heat exchanger 37 cools the circulating water R2 to maintain a water temperature of the circulating water R2 to less than or equal to a predetermined value (e.g., 60 degrees). The circulating water R2 cooled by the heat exchanger 37 is caused to flow back to the drain tank 34.

The circulation path r is provided with a conductivity sensor 38 as an acidity measuring means. An increase in an acidity within the circulating water R2 causes a conductivity of the circulating water R2 to rise. A decrease in the acidity causes the conductivity to lower. Accordingly, the acidity of the circulating water R2 is determined. The acidity determined by the conductivity sensor 38 is sent to the control means 31. While the inexpensive and maintenance-friendly conductivity sensor 38 has been employed, the acidity measuring means may be a pH meter or the like that can measure an acidity more accurately.

A makeup water supply means 39 supplies makeup water (pure water) to the packed tower 35. A water level detecting means, not shown, installed within the drain tank 34 sends a water level of the circulating water R2 within the drain tank 34 to the control means 31. When the water level of the circulating water R2 is below a predetermined value, the control means 31 causes the makeup water supply means 39 to supply makeup water. Further, by the control means 31 opening a third valve v3 and closing a fourth valve v4, makeup water is supplied into the packed tower 35. An amount of supply of makeup water is controlled such that a concentration of the hydrogen fluoride gas G3 is less than or equal to a predetermined value. Reference sign 39a denotes a flow meter that measures a flow of makeup water.

The control means 31 opens or closes the first valve v1, the second valve v2, the third valve v3, and the fourth valve v4, on the basis of flows of the process gas G1, the cleaning gas G2, the hydrogen fluoride gas G3, and the acid drainage water R1 and the acidity of the circulating water R2. Specifically, upon a rise in the acidity of the circulating water R2 to greater than or equal to a threshold value, the first valve v1 and the third valve v3 are opened to lower the acidity by discharging the acid drainage water R1 and diluting the circulating water R2 with water. When the acidity of the circulating water R2 is less than the threshold value, the second valve v2 and the fourth valve v4 are opened to circulate the circulating water R2 within the circulation path r. By controlling an opened or closed time of the drain valve v1, an average drainage flow of the circulating water R2 can be adjusted.

Next, a process with the process gas G1 using the abatement device 30 will be described. An example is described below in which the process gas G1 is monosilane ($SiH_4$) and the cleaning gas G2 is nitrogen trifluoride ($NF_3$). However, the process gas G1 is not limited to monosilane, and the cleaning gas G2 is not limited to nitrogen trifluoride.

Heating, with the heating means 33, of monosilane introduced to the abatement device 30 from the process chamber 10 produces granular silicon dioxide ($SiO_2$), on the basis of a chemical equation of equation 1.

[Equation 1]

$$SiH_4 + 2O_2 \rightarrow SiO_2 + 2H_2O \qquad \text{(Equation 1)}$$

Much of silicon dioxide that has flown into the drain tank 34 exists within the circulation path r as dust with fine particle diameters mixed within the circulating water R2. A part of silicon dioxide passes through the packed tower 35 and is exhausted outside from the outlet port 30a. Proportions of silicon dioxide existing within the drain tank 34 and silicon dioxide exhausted outside vary depending on a type or the like of the abatement device 30, but are, for example, 60% for the former and 40% for the latter.

Next, a process with the cleaning gas G2 using the abatement device 30 will be described.

Heating, with the heating means 33, of nitrogen trifluoride introduced to the abatement device 30 from the process chamber 10 produces gaseous hydrogen fluoride (HF), on the basis of a chemical equation of equation 2.

[Equation 2]

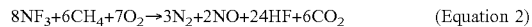

$$8NF_3 + 6CH_4 + 7O_2 \rightarrow 3N_2 + 2NO + 24HF + 6CO_2 \qquad \text{(Equation 2)}$$

Because hydrogen fluoride that has flown into the packed tower 35 via within the drain tank 34 dissolves in water upon passing within the packed tower 35 and drips to the drain tank 34, a concentration of hydrogen fluoride exhausted outside from the outlet port 30a is small (e.g., less than or equal to 3 ppm).

Dissolution of hydrogen fluoride in the circulating water R2 and an increase in the acidity of the circulating water R2 pose a problem of corrosion resistance of the abatement device 30. For example, when stainless steel (grade SUS 316) is used as a constituent material that makes direct contact with the circulating water R2, the concentration of hydrogen fluoride is preferably managed to less than or equal to 0.5% in order to inhibit corrosion of the constituent material in a short period of time. Taking too much margin for an allowed concentration of hydrogen fluoride for the abatement device 30 increases an average drainage flow, consequently increasing a running cost of the abatement device 30. Thus, the conductivity sensor 38 measures the conductivity of the circulating water R2, and, if the acidity is greater than or equal to the threshold value, the first valve v1 and the third valve v3 are opened to raise the flow of the acid drainage water R1 and increase the amount of supply of makeup water, so that the acidity of the circulating water R2 is lowered. The threshold value of the acidity can be set at will. For example, a setting of 0.5% is conceivable.

When, for example, the threshold value is set to 0.5% and only hydrogen fluoride exists within the circulating water R2, i.e., when silicon dioxide does not exist within the circulating water R2, there is a risk of hydrogen fluoride within the circulating water R2 re-volatilizing to increase a concentration of hydrogen fluoride in hydrogen fluoride gas to be exhausted.

However, in an abatement process with the CVD process, granular silicon dioxide that has existed within the circulating water R2 circulating within the drain tank 34 and the circulation path r and hydrogen fluoride dissolved in the circulating water R2 exist in the abatement device 30 to which monosilane and nitrogen trifluoride has been introduced. Silicon dioxide and hydrogen fluoride produce hydrofluorosilicic acid on the basis of a chemical equation of equation 3.

[Equation 3]

$$SiO_2 + 6HF \rightarrow H_2SiF_6 + 2H_2O \quad \text{(Equation 3)}$$

When dissolved in the circulating water R2, hydrofluorosilicic acid produced on the basis of the chemical equation of equation 3 shows acidity, i.e., raises the conductivity of the circulating water R2, in a similar manner to hydrogen fluoride, but without the risk of re-volatilizing as with hydrogen fluoride. Thus, reliability of the abatement device 30 is ensured through management of the acidity of the circulating water R2 to less than or equal to the threshold value using the conductivity sensor 38 described above. A flow of acid drainage water can be reduced, since rising of the acidity due to hydrogen fluoride described above is inhibited by a decrease in hydrogen fluoride and production of hydrofluorosilicic acid. As shown in equation 3, a mole ratio of silicon dioxide and hydrogen fluoride necessary for production of hydrofluorosilicic acid is 1:6. Thus, when a mole ratio of silicon dioxide over hydrogen fluoride within the circulating water R2 is greater than ⅙, i.e., about 0.17, hydrogen fluoride and silicon dioxide react to cause a reaction that produces hydrofluorosilicic acid.

The control means 31 calculates a concentration of silicon dioxide within the circulating water R2 on the basis of the flow of the process gas G1 and the average drainage flow of the circulating water R2. Apart of silicon dioxide remains within the abatement device 30, and the rest is exhausted outside. Apart of silicon dioxide that remains within the abatement device 30 is held within the circulating water R2, and the rest is held within the abatement device 30. Thus, the concentration of silicon dioxide within the circulating water R2 is calculated by multiplying a mole number of silicon dioxide, i.e., a mole number of monosilane within the process gas G1, by a proportion of silicon dioxide held within the abatement device 30 and a proportion held within the circulating water R2. For example, consider a value of 60% for the former and a value of 75% for the latter. In this case, the mole number of silicon dioxide within the circulating water R2 is, from multiplying 0.6 and 0.75, 0.45 times the mole number of monosilane.

The concentration of silicon dioxide within the circulating water R2 is calculated on the basis of an integrated amount of flow of the process gas G1, the flow of makeup water, and the average drainage flow of the circulating water R2. Accordingly, even when only the cleaning gas G2 is introduced upon the process chamber 10 being cleaned or the like, the flow of the acid drainage water R1 can be inhibited, when hydrofluorosilicic acid can be produced on the basis of a remaining amount of silicon dioxide within the abatement device 30.

The control means 31 calculates a concentration of hydrogen fluoride within the circulating water R2 on the basis of the flow of the cleaning gas G2, the flow of makeup water, and the average drainage flow of the circulating water R2. Hydrogen fluoride almost entirely dissolves in the circulating water R2. Thus, a mole number of hydrogen fluoride is three times a mole number of nitrogen trifluoride.

The concentration of hydrogen fluoride is calculated on the basis of an integrated amount of flow of the cleaning gas G2. Accordingly, even when only the process gas G1 is introduced from the process chamber 10 to the abatement device 30, the flow of the acid drainage water R1 can be inhibited, when hydrofluorosilicic acid can be produced on the basis of a remaining amount of hydrogen fluoride within the abatement device 30.

In this manner, the concentration of silicon dioxide and the concentration of hydrogen fluoride within the circulating water R2 are calculated. When a ratio of the concentration of silicon dioxide and the concentration of hydrogen fluoride is greater than or equal to a predetermined value, i.e., greater than or equal to about 0.17, the average drainage flow of the circulating water R2 is lowered to a low flow (e.g., 10 L/min), since hydrofluorosilicic acid is produced. When the ratio of the concentration of silicon dioxide and the concentration of hydrogen fluoride is less than the predetermined value, i.e., less than about 0.17, the average drainage flow of the circulating water R2 is raised to a high flow (e.g., 20 L/min) in order to inhibit re-volatilization of hydrogen fluoride. When the concentration of silicon dioxide and the concentration of hydrogen fluoride within the circulating water R2 are sufficiently low, the average drainage flow of the circulating water R2 can be made zero.

The flow of the circulating water R2 circulating within the drain tank 34 and the circulation path r will be described with an example of when a flow per unit time of the process gas G1 is set to 20 SLM and a flow per unit time of the cleaning gas G2 is set to 50 SLM.

In normal circulation mode (when the concentration of silicon dioxide and the concentration of hydrogen fluoride within the circulating water R2 are sufficiently low), the average drainage flow of the circulating water R2 and the flow of makeup water are each zero, and the flow of the circulating water R2 circulating within the drain tank 34 and the circulation path r are set to 80 L/min as a flow necessary for an abatement process in the abatement device 30. Specifically, in the normal circulation mode, a returning flow of the circulating water R2 circulating via the heat exchanger 37 is set to 70 L/min. The second valve v2 is opened, and a returning flow to the drain tank 34 is set to 10 L/min.

In low flow mode (when the acidity of the circulating water R2 is less than or equal to the threshold value and a condition to produce hydrofluorosilicic acid is satisfied), the drain valve v1 is opened to drain the circulating water R2 as the acid drainage water R1. A drainage flow upon opening the drain valve v1 is set to 30 L/min, and the average drainage flow of the circulating water R2 is controlled to 10 L/min through control of opening and closing the drain valve v1. Thus, the flow of the circulating water R2 within the drain tank 34 and the circulation path r is set to 80 L/min to 100 L/min. Specifically, a minimum flow of the circulating water R2 for when the drain valve v1 is closed is set to 80 L/min, which is a sum of the returning flow (70 L/min) of the circulating water R2 circulating via the heat exchanger 37 and the returning flow (10 L/min) to the drain tank 34. A maximum flow of the circulating water R2 for when the drain valve v1 is opened is set to 100 L/min, which is a sum of the returning flow (70 L/min) of the circulating water R2 circulating via the heat exchanger 37 and the drainage flow (30 L/min) for drainage outside via the drain valve v1. The flow of makeup water upon opening the third valve v3 is set to 20 L/min, and an average flow of makeup water is controlled to 10 L/min through control of opening and closing the third valve v3.

In high flow mode (when the acidity of the circulating water R2 is greater than or equal to the threshold value and the condition to produce hydrofluorosilicic acid is not satisfied), the drain valve v1 is opened to drain the circulating water R2 as the acid drainage water R1. The average drainage flow of the circulating water R2 is controlled to 20 L/min through control of opening and closing the drain valve v1. Thus, the flow of the circulating water R2 within the drain tank 34 and the circulation path r is set to 80 L/min to 100 L/min, in a similar manner to the low flow mode. In the high flow mode, the third valve v3 is always opened, and the flow of makeup water is constant at 20 L/min.

In this manner, when hydrofluorosilicic acid can be produced with silicon dioxide and hydrogen fluoride, the abatement device according to the present invention can reduce the flow of acid drainage water, since volatilization of hydrogen fluoride within the circulating water R2 is inhibited even with the average drainage flow of the circulating water R2 lowered to the low flow. Further, clogging with granular silicon dioxide in equipment on a downstream side of the centrifugal separator 36 provided within the circulation path r can be inhibited.

Further, the present invention allows for various changes other than a modification described above, without departing from the spirit of the present invention. It is needless to say that such changes are covered in the present invention.

The present invention can be applied also a liquid crystal panel manufacturing device, a solar cell manufacturing device, or the like, other than a semiconductor manufacturing device.

REFERENCE SIGNS LIST

10 Process chamber
20 Dry pump
30 Abatement device
31 Control means
32a Flow meter
33 Heating means
34 Drain tank
35 Packed tower
36 Centrifugal separator
37 Heat exchanger
38 Conductivity sensor (acidity measuring means)
39 Makeup water supply means
G1 Process gas
G2 Cleaning gas
G3 Hydrogen fluoride gas
R1 Acid drainage water
R2 Circulating water
r Circulation path
v1 First valve (drain valve)
v2 Second valve
v3 Third valve
v4 Fourth valve

What is claimed is:

1. An abatement device that processes exhaust gas containing silicon and exhaust gas containing fluorine, the abatement device comprising:
   a drain tank for holding circulating water that dissolves silicon dioxide produced from the exhaust gas containing the silicon and hydrogen fluoride produced from the exhaust gas containing the fluorine;
   a circulation path communicating with the drain tank;
   a drain valve provided to the circulation path to drain a part of the circulating water outside;
   a makeup water supply means for supplying makeup water to the circulation path; and
   a control means for controlling the drain valve and the makeup water supply means to control an average drainage flow of the circulating water within the circulation path, for lowering the average drainage flow of the circulating water to a low flow, in response to determining a ratio of a concentration of the silicon dioxide within the circulating water and a concentration of the hydrogen fluoride within the circulating water is greater than or equal to a predetermined value at which hydrofluorosilicic acid can be produced, and for raising the average drainage flow of the circulating water to a high flow higher than the low flow, in response to determining the ratio of the concentration of the silicon dioxide within the circulating water and the concentration of the hydrogen fluoride within the circulating water is less than the predetermined value.

2. The abatement device according to claim 1, wherein the control means determines the concentration of the silicon dioxide on the basis of an integrated amount of flow of the exhaust gas containing the silicon, the average drainage flow of the circulating water, and a flow of the makeup water.

3. The abatement device according to claim 1, wherein the control means determines the concentration of the hydrogen fluoride on the basis of an integrated amount of flow of the exhaust gas containing the fluorine, the average drainage flow of the circulating water, and a flow of the makeup water.

4. The abatement device according to claim 1, further comprising an acidity measuring means for measuring an acidity of the circulating water.

5. The abatement device according to claim 4, wherein the acidity is determined on the basis of a concentration of the hydrogen fluoride within the circulating water measured by a conductivity sensor.

6. The abatement device according to claim 1, further comprising a centrifugal separator that separates the silicon dioxide from the circulating water.

7. The abatement device according to claim 2, wherein the control means determines the concentration of the hydrogen fluoride on the basis of an integrated amount of flow of the exhaust gas containing the fluorine, the average drainage flow of the circulating water, and a flow of the makeup water.

8. The abatement device according to claim 2, further comprising an acidity measuring means for measuring an acidity of the circulating water.

9. The abatement device according to claim 3, further comprising an acidity measuring means for measuring an acidity of the circulating water.

10. The abatement device according to claim 7, further comprising an acidity measuring means for measuring an acidity of the circulating water.

11. The abatement device according to claim 8, wherein the acidity is determined on the basis of a concentration of the hydrogen fluoride within the circulating water measured by a conductivity sensor.

12. The abatement device according to claim 9, wherein the acidity is determined on the basis of a concentration of the hydrogen fluoride within the circulating water measured by a conductivity sensor.

13. The abatement device according to claim 2, further comprising a centrifugal separator that separates the silicon dioxide from the circulating water.

14. The abatement device according to claim 3, further comprising a centrifugal separator that separates the silicon dioxide from the circulating water.

15. The abatement device according to claim 4, further comprising a centrifugal separator that separates the silicon dioxide from the circulating water.

16. The abatement device according to claim 7, further comprising a centrifugal separator that separates the silicon dioxide from the circulating water.

17. The abatement device according to claim 8, further comprising a centrifugal separator that separates the silicon dioxide from the circulating water.

18. The abatement device according to claim 9, further comprising a centrifugal separator that separates the silicon dioxide from the circulating water.

19. The abatement device according to claim 5, further comprising a centrifugal separator that separates the silicon dioxide from the circulating water.

* * * * *